(12) United States Patent
Regner et al.

(10) Patent No.: US 9,712,153 B1
(45) Date of Patent: Jul. 18, 2017

(54) METHOD AND DEVICE FOR RESET MODIFICATION BASED ON SYSTEM STATE

(71) Applicant: FREESCALE SEMICONDUCTOR, INC., Austin, TX (US)

(72) Inventors: Markus Regner, Graefelfing (DE); Thomas H. Luedeke, Oberbergkirchen (DE); Harald Michael Lüpken, Zorneding (DE)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 15/060,058

(22) Filed: Mar. 3, 2016

(51) Int. Cl.
  *H03L 7/00* (2006.01)
  *H03K 17/22* (2006.01)
(52) U.S. Cl.
  CPC .................................. *H03K 17/22* (2013.01)
(58) Field of Classification Search
  CPC ....................................................... H03K 17/22
  See application file for complete search history.

(56) References Cited

U.S. PATENT DOCUMENTS

| | | | |
|---|---|---|---|
| 6,529,053 B2 | 3/2003 | Jensen | |
| 7,089,413 B2 | 8/2006 | Erickson et al. | |
| 7,405,602 B2 | 7/2008 | Saitou | |
| 8,347,296 B2 | 1/2013 | Yasutake | |
| 2010/0109721 A1 | 5/2010 | Fuller | |
| 2014/0298005 A1* | 10/2014 | Culshaw | G06F 1/24 713/100 |
| 2014/0317395 A1 | 10/2014 | Luedeke et al. | |
| 2016/0085279 A1 | 3/2016 | Culshaw et al. | |
| 2016/0232008 A1 | 8/2016 | Luedeke et al. | |

* cited by examiner

*Primary Examiner* — Daniel Puentes

(57) ABSTRACT

Transistor-based semiconductor devices, such as systems on chips, may be supplemented with a reset request mechanism to prevent a reset from causing the semiconductor device to enter into an uncertain, or fail, state. More particularly, a method or mechanism may modify a requested reset for a semiconductor device based on a state of the semiconductor device to prevent the semiconductor device from entering an uncertain, an undesired, or a failed state when the reset is effected with regard to the semiconductor device.

17 Claims, 4 Drawing Sheets

METHOD AND DEVICE FOR RESET MODIFICATION BASED ON SYSTEM STATE

BACKGROUND

Field of the Disclosure

The present application is related to electronic devices, and in particular to transistor-based devices implemented on a semiconductor substrate.

BRIEF DESCRIPTION OF THE DRAWINGS

The present disclosure may be better understood, and its numerous features and advantages made apparent to those skilled in the art by referencing the accompanying drawings.

The use of the same reference symbols in different drawings indicates similar or identical items.

BACKGROUND

Figure 1:
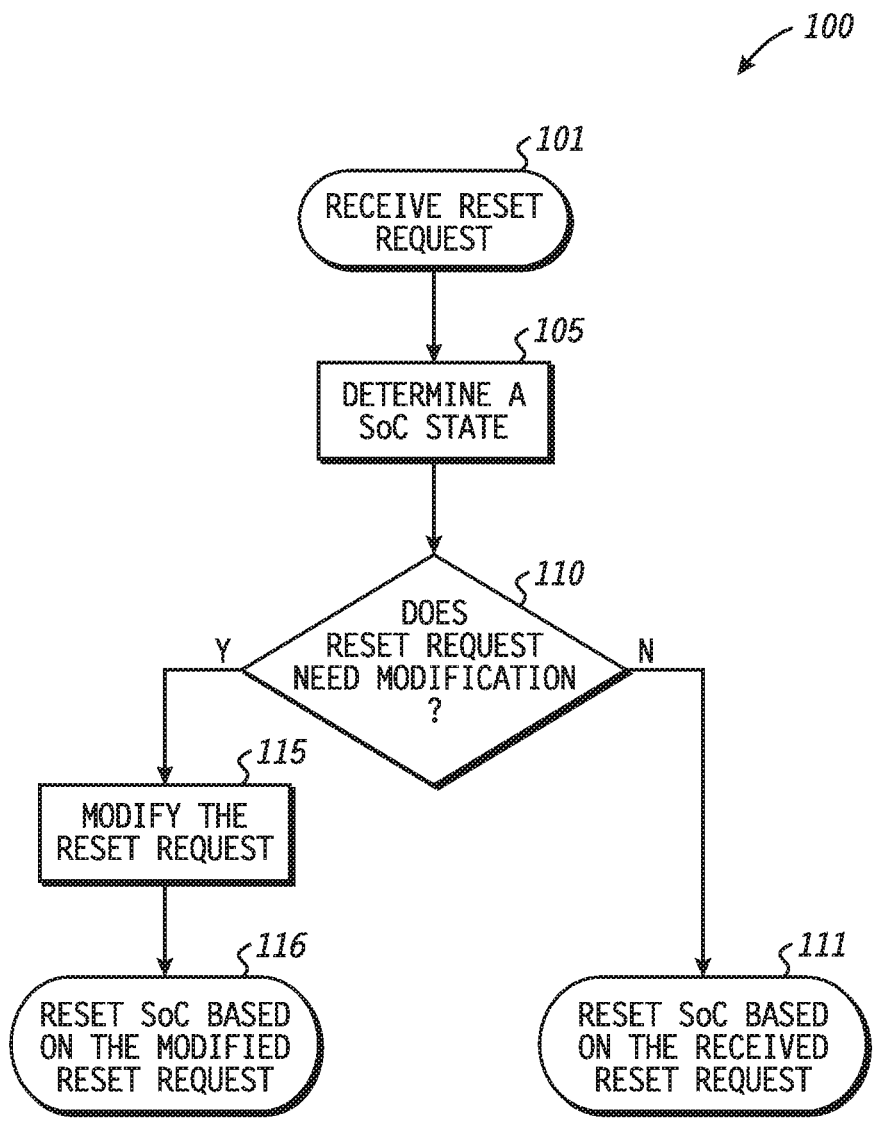
FIG. 1 illustrates an example method of modifying a reset request.

Microchip devices have grown in complexity. Previously, microchip devices were limited to a processor and auxiliary systems for the processor. However, reduction in transistor size has allowed microchip devices to include more functional blocks and thereby become what is commonly referred to as a System on a Chip (SoC). An SoC can include functional blocks that themselves include other functional blocks that likewise include smaller blocks. Blocks, which can also be referred to as electronic "components", are understood to be circuits that may be formed of various other electronic components. For example, an SoC may include multiple processors, clock generators, analog to digital converters, and other components. These SoC components may operate in conjunction with each other to implement a common function, and can be formed on a semiconductor substrate, such as at corresponding portions of a silicon die. Conversely, components of an SoC can be disjoint in operation, wherein their respective functions are isolated from that of other components.

Resets and interrupts can be applied to an SoC. An interrupt is triggered by an interrupt source upon detection of an interrupt event. An interrupt generically refers to an exception that does not truncate current software execution, but instead results in a change of program flow in an orderly manner to facilitate a return to the point where program flow changed upon completion. By contrast, a reset is triggered by a reset source upon detection of a reset event, and generically refers to a hardware reaction that truncates current software execution to implement a particular set of hardware controlled operations, which can include execution of various forms of programming code. The reset reaction is implemented with the intent of placing hardware of the SoC in a particular state. For example, a specific SoC component that has detected an event indicating a need for a reset, such as an abnormally low operating voltage, can generate a reset that reinitializes the SoC to a start-up condition. Given the complexity of modern SoCs, the effect of a reset from a particular block of the SoC can be indeterminate depending upon the state of other blocks of the SoC. This can result in situations where a reset causes the SoC as a whole to enter an undesirable state.

DETAILED DESCRIPTION

Embodiments described herein can modify a reset request having a particular characteristic to be a reset request having a different characteristic based on one or more states associated with the SoC. By modifying the characteristic of a reset request, it is possible to prevent the SoC from entering an undesirable state, e.g., an unpredictable state, or a known state that causes failure, had the original reset been left unmodified. For example, if it is known that a reset having a specific characteristic will cause an SoC to enter an undesirable state by virtue of the SoC being in a particular state, the specific characteristic of the reset can be modified to be a reset having a different characteristic that does not cause the SoC to enter the undesirable state. Two examples of reset characteristics include a temporal characteristic, which controls when a requested reset occurs, and a type characteristic, wherein reset requests of different types are associated with reset reactions that perform different operations. For ease of description, reset requests of different types are primarily referenced herein.

According to an embodiment, a SoC device can include a reset preprocessor that receives reset requests, generated by various reset sources, and SoC state information that is used to determine whether to modify a characteristic of the received requests. Thus, based upon the state information of the SoC, the reset preprocessor can modify a received reset request of a specific type to be a reset request of a different type. For example, the reset preprocessor can modify a reset of a first type to be a reset of a second type whenever the SoC is in a particular state that is known to be incompatible with the resets of the first type, e.g., will cause the SoC to enter an undesirable state. As used herein, an undesirable state is intended to mean an uncertain state, an unstable state, a specific state determined to cause an error condition, and the like. Execution of the second type reset results in a reset reaction being implemented that is different, e.g., more or less comprehensive, than that of the first type reset, and therefore does not cause the SoC to enter the undesirable state.

FIG. 1 illustrates a flowchart 100 of modifying a reset request in accordance with embodiments described herein. At node 101, a reset request having a particular type is received. The reset request has been generated in response to a reset event being detected at a particular component of the SoC. Note that more than one component of the SoC can generate resets of the same type based upon the same or different reset events. For example, a low voltage in a block of the SoC can cause a reset of first type to be generated, while a particular value residing at a register in the same or a different block can also result in a reset of the first type being generated.

As discussed previously, the reset request of node 101 is of a particular type that has a corresponding reset reaction in the SoC when the reset request is handled. Thus, each different type of reset request has a different corresponding reset reaction that implements a specific set of actions that is different than the set of actions implemented by each other reset type. The term "intensity" as used herein in reference to a particular type of reset is intended to refer to a specific set of actions implemented by the reset reaction of that particular type of reset. For example, a reset of a first type can have a first intensity and a reset of a second type can have a second intensity, wherein the reset reactions implemented by the first and second reset types are different. As used herein, the term "intensity" as used in combination with the terms "high" or "low", and their variants, to compare different types of resets is intended to refer to the number of actions implemented by each relative the respective reset reaction of that particular type of reset. For example, a high-intensity reset can be associated with a reset reaction that implements a particular set of actions. While the low-intensity reset of the system would be associated with a different reset reaction that implements a different set of actions that does not include all of the actions of the particular set associated with the high-intensity reset. In a particular embodiment, a lower intensity reset can implement a subset of actions in comparison to a higher intensity reset.

At node 105, an SoC state is determined. It will be appreciated that the SoC state can be based upon information from one or more of the various components of the constituent SoC blocks. For example, an SoC state may indicate the manner a particular component, such as a register, is currently being configured, whether a particular process is currently ongoing, and the like.

At node 110 it is determined if the reset request received at node 101 is to be modified based upon the state of the SoC determined at node 105. It will be appreciated that node 110 can compare a list of states that have been predetermined to be problematic for a particular reset type, and in response, to change the current reset to a type that is not problematic. The list of known states, and the alternate reset type to be forwarded, can be fixed, programmable, or a combination thereof. Thus, at node 110, if the state determined at node 105 matches a state known to be problematic for a particular reset type the flow proceeds to node 115, where the received reset request is modified to be a different type reset request. At node 116, the modified reset request is used by a reset processor to implement a reset reaction corresponding to the modified reset request 116. Otherwise, flow proceeds to node 111, where the original reset reaction of the request received at node 101 is implemented.

In this manner, an original reset request received at node 101 may be changed to have a different characteristic that mitigates or prevents the SoC from entering an undesirable state. Building on the above example, if the reset request would have caused certain SoC registers to have an undesirable value, then the reset request may be changed to select a reset request that results in a reset reaction that places these registers into a desirable state, such as a known state. Thus, a register that is not set to a known value by reset request of a first type can be set to the known value by virtue of the modified reset request replacing the original reset request, which can correspond to increasing the reset intensity by virtue of implementing all of the reset reactions associated with the original reset request and an additional reset reaction that assures a desired state of the register.

Figure 2:
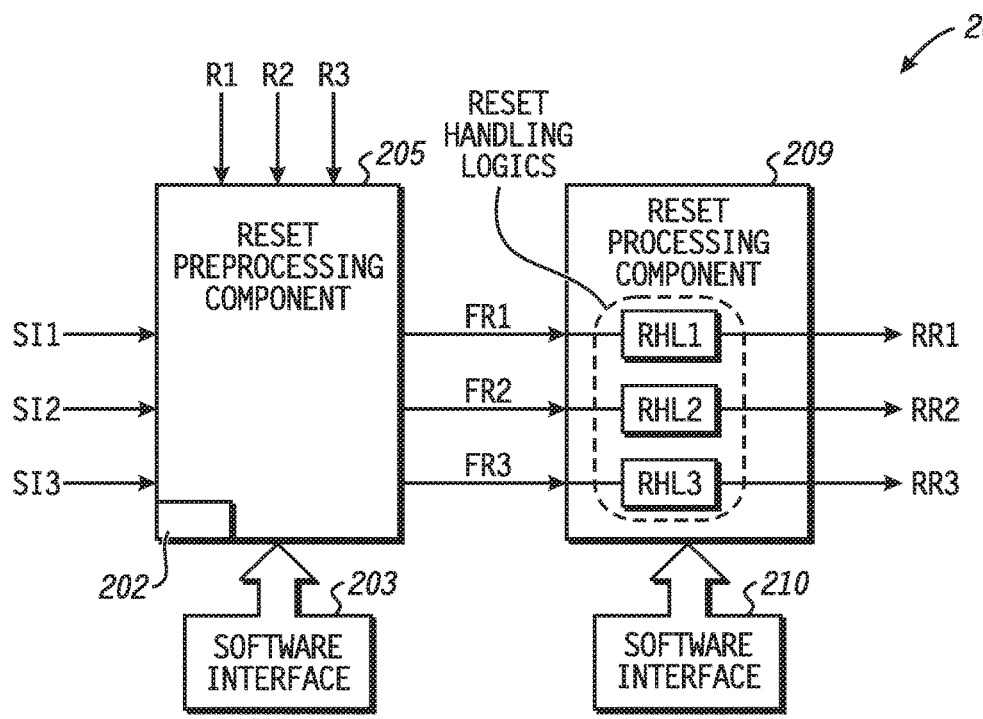
FIG. 2 illustrates an example embodiment of a reset device.

FIG. 2 illustrates a high-level view of a system 200 for modifying reset requests in accordance with particular embodiments. System 200 comprises reset preprocessing component 205 and reset processing component 209. Reset preprocessing component 205 includes reset modification logic 202, and may be accessed or configured by software interface 203. Reset processing component 209 includes reset handling logics RHL1-RHL3 that implement a particular reset reaction, and may be accessed or configured by software interface 210.

Reset preprocessing component 205 receives reset requests of different types. By way of example, the different type resets can include a type 1 reset, a type 2 and a type 3 reset, which are also referred to as a reset of first type, a reset of second type and a reset of a third type, respectively. By way of example, it is presumed resets are communicated by asserting a signal at a particular interconnect. Thus, in the illustrated embodiment, each reset of a different type is transmitted over a different interconnect, labeled R1-R3. Reset preprocessing component 205 also receives reset state indictors over interconnects labeled SI1-SI3.

Reset preprocessing component 205 forwards a reset request that may be of the same or different type as the received reset request based on some or all of the state information available to the preprocessing component 205. Thus, reset preprocessing component 205 will forward a reset request by asserting an interconnect, labeled FR1-FR3, to reset processing component 209 for handling, wherein the forwarded reset request can be of a type that is the same or different than the reset type of the received reset request. Note, for convenience, the labels assigned herein to various interconnects and signals can be used interchangeably to refer to one or more of a signal, an interconnect, an input/output, and the like. For example, as used herein, it would be proper to state that a signal R1 is transmitted over the interconnect R1 and received by input R1 of component 205.

Reset processing component 209 receives the forwarded reset requests FR1-FR3 from reset preprocessing component 205 and implements corresponding reset reactions, over interconnects RR1-RR3, based upon the forwarded reset requests it receives. Interconnects RR1-RR3 represent various functions, control signals, or the like that are associated with implementing a reset reaction in accordance with the reset request forwarded from reset preprocessing component 205.

According to an embodiment, each one of the reset request inputs R1-R3 is a different type reset request with different characteristics, presumed to be reset requests of different intensities. For example, reset request input R1 is associated with a specific intensity of reset reaction that resets specific components or blocks of the SoC, while reset request input R2 is associated with a different intensity of reset reaction that resets different specific components or blocks of the SoC. Thus, different reset request inputs R1-R3 are associated with different intensities and reset requests may be made to system 200 by various components of the SoC by sending a signal to the reset preprocessing component 205 on a desired reset request input R1-R3. Multiple reset sources may be coupled to the same interconnects over which asserted reset signals, R1-R3, are transmitted. For example, a reset source such as a particular block may be coupled to a specific reset request input Rx (one of R1-R3) corresponding to an intensity that will reset the block as a reset reaction in response to a reset event at the block. Similarly, each one of the forwarded reset requests FR1-FR3 is a different type reset request that can correspond one-to-one to the reset request inputs R1-R3.

Reset processing component 209 receives the forwarded reset requests, FR1-FR3, and includes reset handling circuitry RHL1-RHL3 that generate reset reaction outputs RR1-RR3. Each of reset handling circuitry RHL1-RHL3 corresponds to a respective one of the forwarded reset requests FR1-FR3, and generates corresponding reset reactions RR1-RR3. For example, reset handling circuitry RHL1 can include logic that is activated in response to receiving a forwarded reset request FR1, and generates a particular reset reaction RR1 by asserting a set of operations that implement the reset reaction in accordance with the intensity of the reset request FR1.

Thus, during operation of system 200, reset preprocessing component 205 receives a specific reset request on one of reset request interconnects R1-R3 in response to a reset event at a reset source. Reset preprocessing component 205 further receives state indicators SI1-SI3 indicating three different sets of state information of the SoC. It will be appreciated that each of the state indicators SI1-SI3 includes information that indicates specific state information for a particular SoC block, such as the current value of a register at a particular block of the SoC. For example, the state indicator could indicate a state of a particular register of the reset source. In an alternate embodiment, one or more of the state indicators SI1-SI3 can be asserted when a particular state is detected that is based upon a plurality of basic state information. For example, a state indicator can be asserted in response to a particular value being asserted at a register of one block at the same time a different block of the SoC is performing a particular task.

When an asserted reset signal is received at the reset preprocessing component 205, the reset modification logic 202 of preprocessing component 205 determines whether the received reset request should be modified or merely passed along as an asserted signal at corresponding forwarded reset requests FR1-FR3. Thus, as illustrated, reset preprocessing component 205 may cause a received reset request to be modified to become a modified reset request, e.g., become a reset request of a different type, based on state indictors SI1-SI3. The modified reset request may then be passed to reset processing component 209 by asserting a signal transmitted over one of the interconnects FR1-FR3. Reset processing component 209 processes forwarded reset requests at the corresponding reset handling logic RHLx and implements appropriate reset reaction operations, RR1-RR3, to implement reset reactions in accordance with the modified reset requests.

For example, a low voltage detector detecting a low voltage condition in a block of the SoC can cause an asserted signal to be transmitted over interconnect R1, e.g., a transmitted reset request of a first type, to request a reset reaction corresponding to a type 1 reset request be implemented. Reset request R1 is received at reset preprocessing component 205 along with state indicators SI1-SI3. Reset request R1 is processed by reset modification logic 202 based on state indicators SI1-SI3 to determine if the received request (R1) is to be modified such that a reset request of the same or different type is to be forwarded to reset processing component 209 via forwarded reset requests FR1-FR3. Thus, if the reset modification logic 202 determines, based upon the current state indicators SI1-SI3, that an incompatible state exists for the received reset request R1, a forwarded reset request will be generated having a different reset type, e.g., not forwarded reset request FR1. Such a modification can, for example, ensure a specific register or circuitry does not have an undesirable configuration after reset. When the modified reset request (FR2 or FR3) is received at the reset processing component 209, the reset request is handled to effectuate the reset reaction corresponding to the modified reset. If however, the reset request input R1 is compatible with the current state indicators SI1-SI3, its direct equivalent, forwarded reset request FR1, can be forwarded to reset processing component 209.

While system 200 illustrates a one-to-one correspondence between the number of forwarded reset requests FR1-FR3 and the number of reset request inputs R1-R3, this relationship is by way of illustration. In various embodiments, there may be more or less forwarded reset requests than reset requests. In addition, based upon the state indicators, the reset preprocessing component 205 can generate multiple reset requests of different types for a single reset request of a specific type. In embodiments also, a set of reset requests received at the preprocessing component 205 can forward a set of reset requests having more or less reset requests than the number of reset requests in the received set of reset requests. For example, if a reset request R1 and a reset request R2 are received concurrently, the reset preprocessing component 205 may determine, based on the state indicators, that only one of these two requests is to be forwarded. Alternatively, if a reset request R1 is received, the reset preprocessing component 205 may determine, based on the state indictors, that multiple reset requests, FR1 and FR2, are to be forwarded. Still further in embodiments, multiple characteristics of a reset request may be modified: for example, a received reset request R2 can be changed to FR1 and delayed.

Figure 3:
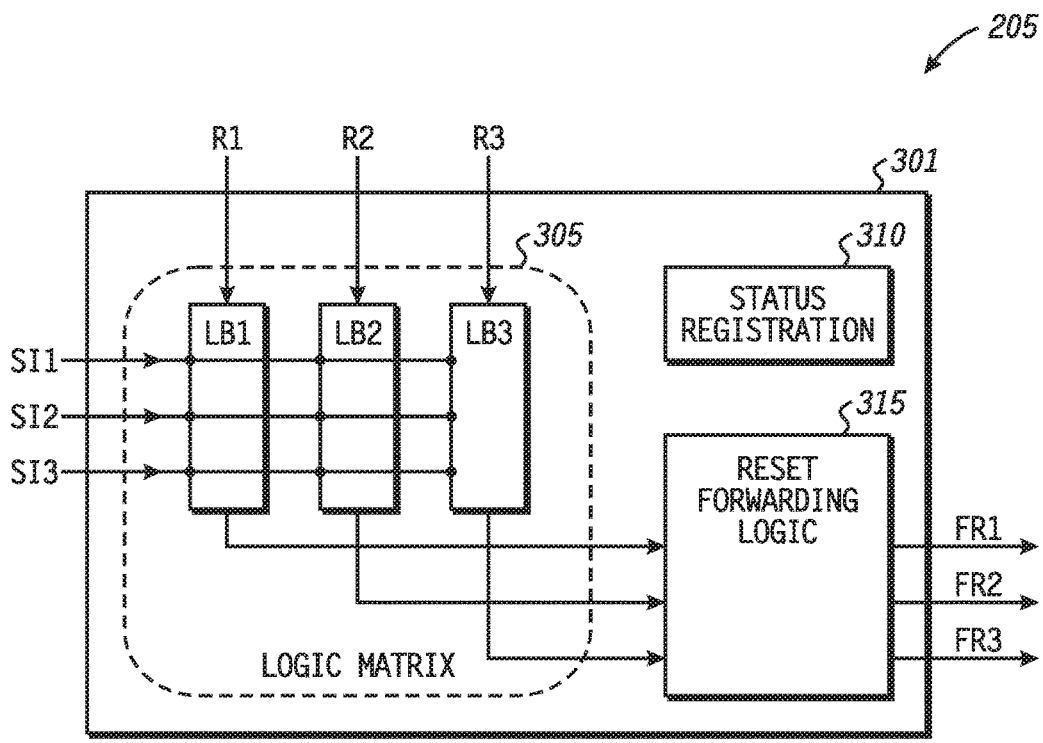
FIG. 3 illustrates an example embodiment of a component of the reset device shown in FIG. 2.

FIG. 3 illustrates an embodiment of reset preprocessing component 205 that includes reset modification circuitry 301. Reset modification circuitry 301 can correspond to reset modification logic 202 of FIG. 2, and can include circuitry 305, status registration circuitry 310, and reset forwarding logic 315. Reset modification logic 301 includes logic matrix 305, with a plurality of logic blocks LB1-LB3. As can be seen from FIG. 3, there is a one-to-one correspondence between the number of received reset types and the number of logic blocks, so that each one of logic blocks LB1-LB3 corresponds to a specific received reset type, R1-R3. Each one of logic blocks LB1-LB3 receives each state indictor of the state indicators SI1-SI3, though it will be appreciated in other embodiments that for a particular reset request, only a portion of the state indicators may be needed.

Status registration circuitry 310 includes a set of status registers that capture information based on some or all of: state indicators SI1-SI3, received reset requests R1-R3, and forwarded reset requests. The status registers allow software, when the SoC returns from a reset sequence, to retrieve data indicating the state of the SoC at the time the reset sequence was entered. This data can then be used by the software to determine what has taken place to decide what subsequent actions should be taken. In some embodiments, a further module (not shown) may use data from the status registration 310 to initiate, for example, some kind of clean-up activity on the SoC. The logic matrix is connected to provide a number of forwarded reset requests to the reset forwarding circuitry 315, as will be described in greater detail below. The reset forwarding circuitry is connected to the logic matrix 305 to determine, based upon the information received from the logic matrix 305, which of the forwarded reset requests FR1-FR3 should be asserted.

Figure 4:
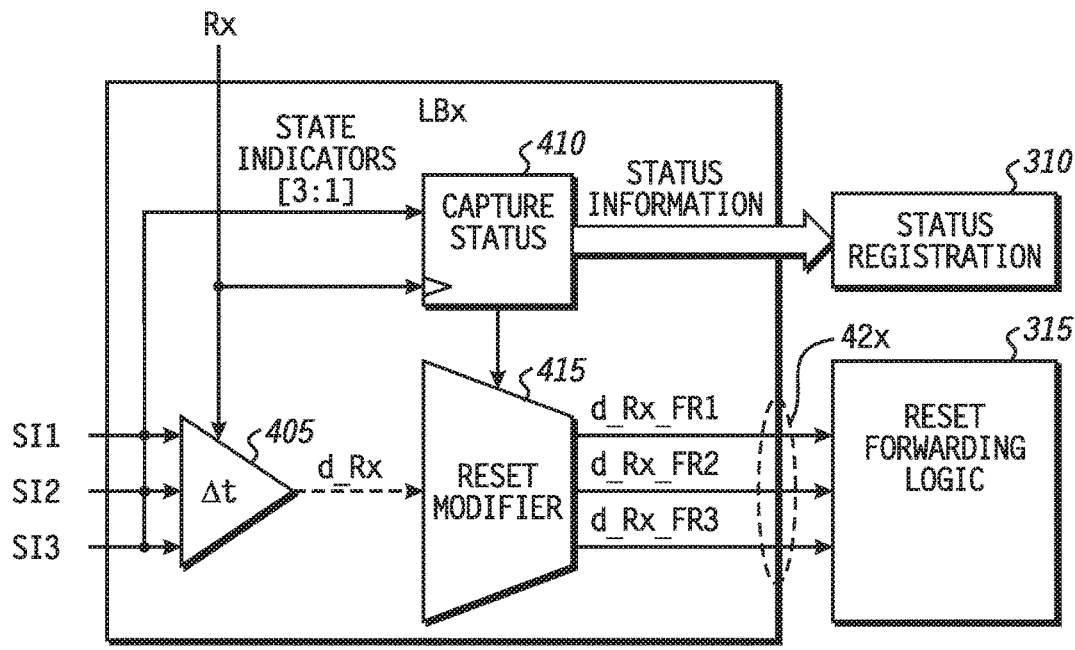
FIG. 4 illustrates an example embodiment of a logic block shown in FIG. 3.

FIG. 4 illustrates an example embodiment of a LBx circuitry of FIG. 3. For example, FIG. 4 can correspond to logic block LB1 of FIG. 3 that receives reset request input R1 and logic state indicators SI1-SI3. Circuitry LBx includes circuitry used to change various characteristics of the reset request R1. As illustrated, circuitry LBx includes temporal circuitry 405, capture status circuitry 410, and reset modifier circuitry 415.

Capture status module 410 stores the state of state indicators SI1-SI3 upon assertion of the reset Rx. This information, and other information as described herein, is further provided to status registration 310, and to reset modifier logic 415.

Temporal logic 405 receives state indicators SI1-SI3 and reset request input Rx, and generates a forwarded request d_Rx. Temporal logic 405 forwards the request d_Rx after determining, based upon the state indicators SI1-SI3, if a temporal characteristic of request Rx is to be modified. Thus, temporal logic 405 can determine whether reset request Rx should be temporally adjusted, e.g., delayed. If not, the signal d_Rx is promptly asserted, e.g., without intended delay.

Otherwise, if the reset request Rx is to be temporally adjusted, the assertion of the signal d_Rx is delayed by a predetermined amount of time. The predetermined amount of time can be a fixed attribute of the LBx circuitry, or it can be based upon a value stored at storage location that is programmable by an instruction processing module (not shown) of system 200, such as by an external user or application instructions. For example, for a current set of state indicators, temporal circuitry can determine that the reset request input should be delayed by a certain amount of time before being forwarded to the reset modifier module 415 for further processing. Therefore, the signal d_Rx, which is of the same type a request Rx, will be delayed. Temporal logic 405 may store various delay periods corresponding to different status indicators. These various delay periods may be programmed via software interface 203. Furthermore, in the event of an assertion of one or more state indicators SIx, the reset request may be delayed by an indeterminate amount of time that is based upon when the relevant state indicators(s) SIx are unasserted.

In response to receiving the reset request d_Rx from temporal reset logic 405 and the state indicators SI1-SI3 stored at capture status 410, reset modifier module 415 will determine whether the reset request Rx should be maintained as type x, or modified. Thus, as described above with respect to logic matrix 305, reset modifier module 415 can include circuitry that defines a set of rules that determines whether for a given set of state indicators SI1-SI3 the type characteristic of reset request Rx should be maintained, or should be modified.

For example, assuming x is the numeral 1, Rx is R1, for a given set of values for some or all of the state indicators SI1-SI3 the reset request R1 is maintained, e.g., its type remains the same, by asserting a signal at interconnect d_R1_FR1. For a different set of state indicators SI1-SI3 the reset request d_R1 can be changed to a different type reset, e.g., by asserting one of d_R1_FR2 or d_R1_FR3. Thus, output 42x corresponds to interconnects for each possible reset type that can be forwarded based upon the received reset Rx, and the state indicators SI1-SI3. For example, the reference numeral 421 corresponds to the output 42x for LB1, the reference numeral 422 corresponds to the output 42x for LB2, and the reference numeral 423 corresponds to the output 42x for LB3, each of which are passed to reset forwarding logic 315. Generally, reset forwarding logic 315 maps the logic block outputs from the logic block and constituent signals onto one or more reset requests which may or may not be a modified reset request.

Figure 5:
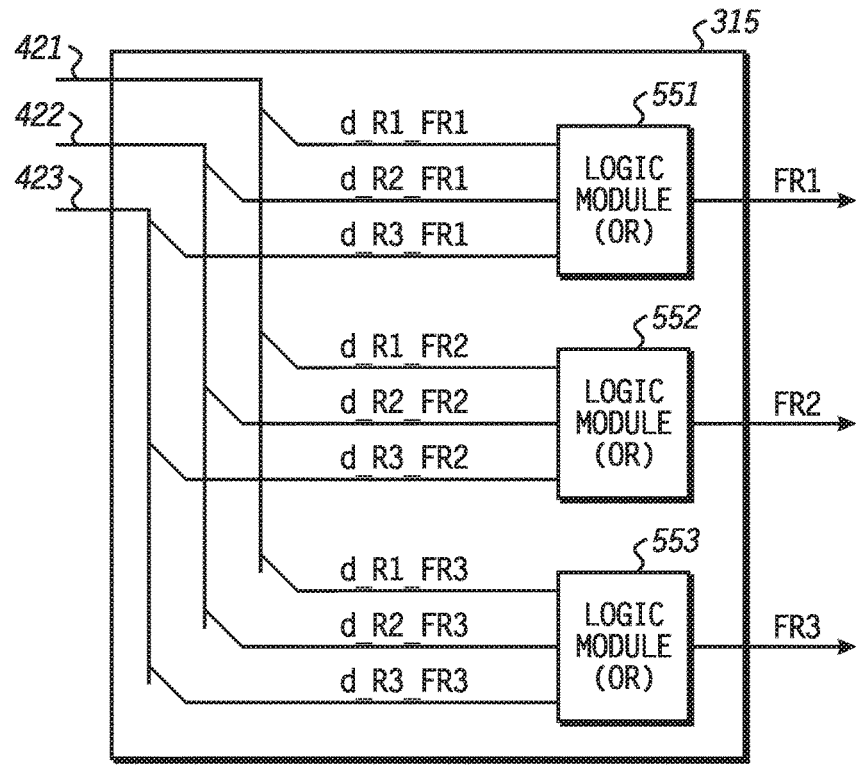
FIG. 5 illustrates an example embodiment of a reset modifier shown in FIGS. 3 and 4.

FIG. 5 illustrates an example embodiment of reset forwarding circuitry 315 that receives reset requests 421-423, and includes logic modules 551-553. Reset forwarding logic 315 receives forwarded reset requests 421-423 from each of LB1-LB3. The logic modules 551-553 implement a selection operation to determine whether to assert a received reset request. According to an embodiment, the logic modules 551-553 are OR gates, wherein if one or more of the reset requests R1-R3 has been forwarded as a type 1 reset, which corresponds to the reset request R1, the reset signal FR1 will be asserted. Similarly, the reset signal FR2 and FR3 will be asserted if any of the reset requests, are forwarded as type 2 or type 3 resets, respectively.

Forwarded reset requests FR1-FR3 are handled by reset processing component 209 (of FIG. 2) with regard to the SoC so that the SoC is reset without entering an uncertain or indeterminate state. In embodiments, several forwarded reset requests FR1-FR3 may be generated in the same time frame and received at reset processing component 209. Reset processing component 209 handles the reset reaction with regard to receiving more than one forwarded reset request in a time frame. Typically the (forwarded) reset request which triggers the most intense reset reaction gets precedence and the reset reaction with the highest intensity "wins" in handling of the forwarded reset requests at reset processing component 209.

Figure 6:
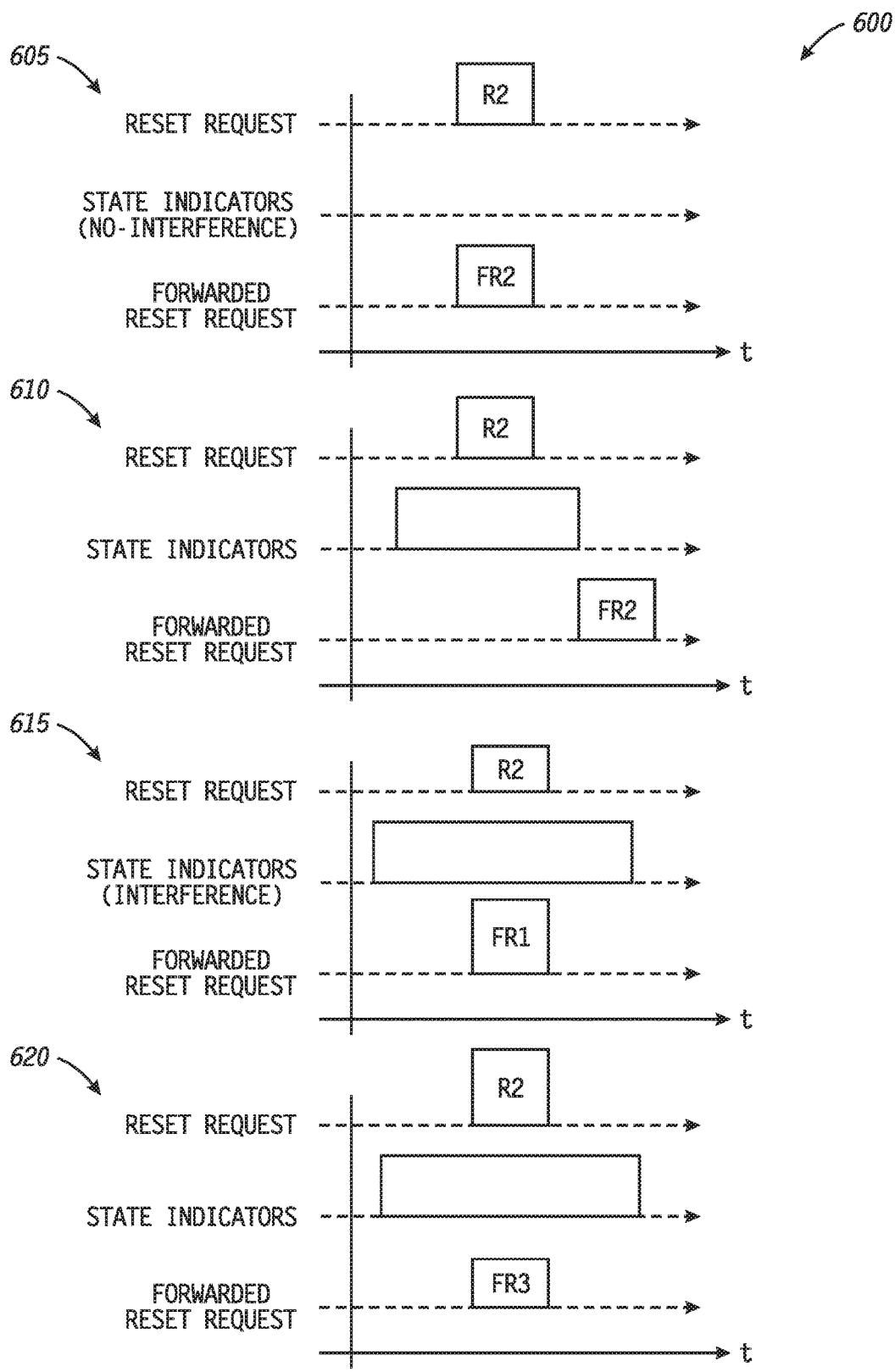
FIG. 6 illustrates examples of reset modifications.

FIG. 6 illustrates examples 600 of reset modification graphs. Each graph corresponds to a received reset signal R2, wherein it will be appreciated that each received reset signal can be represented by a different graph. Graph 605 illustrates what occurs when the state of an SoC is such that there is no interference with R2. In particular, because there is no asserted signal illustrated for the STATE INDICATOR signal of graph 605, when the signal R2 is received at the RESET REQUEST signal of graph 605 it is merely forwarded, as illustrated by signal FR2 at the FORWARDED RESET REQUEST signal of graph 605.

Graph 610 differs from graph 605 in that it has been determined that the state indicators do interfere with R2, as illustrated by the asserted STATE INDICATORS signal, e.g., the conflict exists during the duration of the asserted STATE INDICATORS signal. Thus, when reset request R2 is received, graph 610 illustrates that a temporal characteristic of the received reset request R2 is modified, while leaving the reset type the same. Specifically, the reset request FR2 has been delayed until after the conflicting state indicators no longer match the predetermined state criteria.

Graph 615 illustrates the effect of modifying a type characteristic of a reset. Specifically, the state indicators meet a predefined interference criteria that indicates an undesirable reset result will occur if the received reset R2 is allowed to proceed. Therefore, a type 1 reset, FR1, is forwarded instead of the type two reset, FR2. In the illustrated embodiment, the area of the forwarded type 1 reset is greater than the area of the original type 2 reset to indicate that the type 1 reset can have a greater intensity than the type 2 reset. For example, the reset operations implemented by the type 2 reset can be a subset of the reset operations implemented by the type 1 reset.

Graph 620 also illustrates the effect of modifying a type characteristic of a type 2 reset. Specifically, when reset R2 is generated, the state indicators meet a predefined interference criteria that indicates an undesirable reset result will occur if the reset R2 is allowed to proceed. Therefore, a type 3 reset, FR3, is forwarded instead of the type 2 reset, FR2. In the illustrated embodiment, the area of the forwarded type 3 reset is less than the area of the original type 2 reset to indicate that the type 3 reset can have a lesser intensity than the type 2 reset. For example, the interference may be the result of a reset reaction for a different reset request being currently implemented, wherein the subsequent request R2 of graph 620 would result in duplicative actions, if executed. Therefore, the R2 reset request is modified to have a lesser intensity that only performs those actions that need repeating, or that have otherwise not be implemented.

While not shown in examples 600, a reset request, may, in some embodiments, be modified into two or more reset requests, which may be un-delayed, delayed similarly, or delayed differently. Furthermore, these reset requests may be temporally staggered such that the reset requests occur at different times.

According to embodiments, the state information does not include an indication of other reset states. For example, state information may be indicative of a state of a block or component thereof and may be distinct from indicating other reset requests.

Note that not all of the activities described above in the general description or the examples are required, that a portion of a specific activity may not be required, and that one or more further activities may be performed in addition to those described. Still further, the order in which activities are listed is not necessarily the order in which they are actually performed. In some embodiments, the intensity of a reset request can be weakened so that no forwarded reset request is generated at all when certain state indicators are asserted. In this case a reset request can get discarded under specific state conditions.

As would be understood by one of skill in the art, the terms "logic", "components", "blocks" and the like as used with reference to a particular feature are not intended to limit the manner in which its corresponding feature is implemented. Thus, it will be appreciated that these terms refer to circuitry that implement particular operations as described. Such circuitry can include instruction based data processors and memory circuits that store instructions executed by the instruction based data processor, or non-instruction based combinational logic circuits, state machines, and the like. This is by way of explanation not limitation, and logic and modules may be implemented by other physical devices or components.

In the foregoing specification, the concepts have been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

For example, the embodiments disclosed in FIGS. 2-5 are discussed with regard to three reset request inputs and three state indicator inputs, this is by way of illustration, and embodiments in accordance with this disclosure are not so limited. For example, a reset preprocessing component may receive any number of different state indictors and may receive any number of reset requests of different types and characteristics. Similarly, while the embodiments disclosed in FIG. 2 and other figures show three possible reset reaction outputs, this is by way of example, and embodiments may result in or output any number of reset reactions. Still further, while the embodiments disclosed in FIG. 2 and other figures show three possible forwarded reset requests, this is by way of example, and different embodiments may output different numbers of different forwarded reset requests and the number of these different forwarded reset requests may or may not correspond to the number of possible reset request inputs.

Embodiments disclosed herein include a device implemented in a System on a Chip (SoC), the device comprising a reset processing circuit, and a reset preprocessing circuit configured to receive a first state information of the SoC and reset signals of different reset types, including a first type and a second type, and modify a first received reset signal of the first type based on the first state information, to be a first forwarded reset signal of the second type that is transmitted to the reset processing circuit. The reset processing circuit may implement a different reset reaction for reset signals of different types received from the reset preprocessing circuit, including a first reset reaction for reset signals of the first type, and a second reset reaction for reset signals of the second type.

In embodiments, the reset preprocessing circuit may include a first reset modification circuit configured to determine if the first state information of the SoC meets a first criteria, change the type of the first forwarded reset signal, corresponding to the first received reset signal, to be of the second type if the first state information meets the first criteria, and maintain the type of the first forwarded reset signal to be the same as the type of the first received reset signal if the first state information does not meets the first criteria.

The reset preprocessing circuit may include first and second logic blocks, and reset mapping circuitry, where the reset preprocessing circuit is configured to further receive a second state information of the SoC, the first logic block is configured to determine a first possible type of the first forwarded reset signal based on the first received reset signal and the first state information, the second logic block is configured to determine a second possible type of the first forwarded reset signal based on the first received reset signal and the second state information, and the reset mapping circuitry is configured to select the reset type of the first forwarded reset signal from the first and second possible types based upon a select criteria.

The reset preprocessing circuit may include temporal reset circuitry that is configured to apply a delay period based on the first state information meeting a temporal criteria prior to transmitting the first forwarded reset signal of the second type to the reset processing circuit. A set of reset types received by reset preprocessing circuit may be the same as the reset types provided by the reset processing circuit. A first set of reset types received by reset preprocessing circuit may be different than a second set of reset types generated by the reset processing circuit. The first set may be a subset of the second set. The second set may be a subset of the first set.

Embodiments disclosed herein may include a method performed in a semiconductor device and said method may include receiving a reset request having a first characteristic, determining whether the received reset request is to be modified based on the first characteristic and a first state of the semiconductor device, transmitting a forwarded reset request having a different characteristic than the first characteristic of the received reset request if it is determined the first characteristic of the received reset request is to be modified or otherwise transmitting the forwarded reset request having the first characteristic if it is determined the received request is not to be modified, and resetting the semiconductor device based on the characteristic of the forwarded reset request.

The characteristic may be a type characteristic, where reset requests of different types are associated with different reset reactions. The received reset request of the first characteristic may be associated with a first reset reaction that includes an action that is not associated with the forwarded reset request of the different characteristic. The received reset request of the different characteristic may be associated with a first reset reaction that includes an action that is not associated with the forwarded reset request of the different characteristic. The characteristic may be a temporal characteristic and the received reset request may be modified through transmitting the forwarded request after a delay period. The delay period may be stored at a programmable storage location.

Embodiments disclosed herein include an integrated semiconductor device having a reset preprocessor which in turn includes a first input configured to receive a reset request, a second input configured to receive a first state of the device, reset modification circuitry configured to generate a modified reset based upon the reset request received at the first input and based upon the first state of the device, and an output configured to transmit the modified reset. The integrated semiconductor device may also have a reset processor configured to effectuate a reset reaction based on the modified reset. The reset modification circuitry may be configured to generate the modified reset by modifying a type of the modified reset request as compared to the received reset request.

The integrated semiconductor device may adjust a temporal application of the reset request to the semiconductor device. In one or more embodiments, the first state is a state of a first portion of the semiconductor device that implements a first function, and the reset request is from a second portion of the semiconductor device that implements a second function. The reset preprocessor may be implemented with an application-specific integrated circuit (ASIC).

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

What is claimed is:

1. A device implemented in a System on a Chip (a SoC), the device comprising:
    a reset processing circuit comprising temporal reset circuitry, the reset preprocessing circuit configured to:
        receive a first state information of the SoC, and reset signals of different reset types, including a first type and a second type, and
        modify a first received reset signal of the first type, based on the first state information, to be a first forwarded reset signal of the second type that is transmitted to the reset processing circuit, wherein the temporal reset circuitry is configured to apply a delay period based on the first state information meeting a temporal criteria prior to transmitting the first forwarded reset signal of the second type to the reset processing circuit, the delay period variable based on the first state information.

2. The device of claim 1, wherein the reset processing circuit implements a different reset reaction for reset signals of different types received from the reset preprocessing circuit, including a first reset reaction for reset signals of the first type, and a second reset reaction for reset signals of the second type.

3. The device of claim 1, wherein the reset preprocessing circuit comprises:
    a first reset modification circuit configured to:
        determine if the first state information of the SoC meets a first criteria,
        change the type of the first forwarded reset signal, corresponding to the first received reset signal, to be of the second type if the first state information meets the first criteria, and
        maintain the type of the first forwarded reset signal to be the same as the type of the first received reset signal if the first state information does not meets the first criteria.

4. The device of claim 1, wherein the reset preprocessing circuit comprises:
    first and second logic blocks; and
    reset mapping circuitry, wherein
        the reset preprocessing circuit is configured to further receive a second state information of the SoC,
        the first logic block is configured to determine a first possible type of the first forwarded reset signal based on the first received reset signal and the first state information,
        the second logic block is configured to determine a second possible type of the first forwarded reset signal based on the first received reset signal and the second state information, and
        the reset mapping circuitry is configured to select the reset type of the first forwarded reset signal from the first and second possible types based upon a select criteria.

5. The device of claim 1, wherein a set of reset types received by reset preprocessing circuit is the same as the reset types provided by the reset processing circuit.

6. The device of claim 1, wherein a first set of reset types received by reset preprocessing circuit is different than a second set of reset types generated by the reset processing circuit.

7. The device of claim 6, wherein the first set is a subset of the second set.

8. The device of claim 6, wherein the second set is a subset of the first set.

9. A method performed in a semiconductor device, the method comprising:
    receiving a reset request having a first characteristic;
    determining whether the received reset request is to be modified based on the first characteristic and a first state of the semiconductor device;
    transmitting a forwarded reset request having a different characteristic than the first characteristic of the received reset request if it is determined the first characteristic of the received reset request is to be modified, otherwise transmitting the forwarded reset request having the first characteristic if it is determined the received request is not to be modified; and
    resetting the semiconductor device based on the characteristic of the forwarded reset request, wherein the characteristic includes a temporal characteristic and the received reset request is modified by transmitting the forwarded request after a delay period, the delay period based on the first state.

10. The method of claim 9, wherein the characteristic is a type characteristic, wherein reset requests of different types are associated with different reset reactions.

11. The method of claim 10, wherein the received reset request of the first characteristic is associated with a first reset reaction that includes an action that is not associated with the forwarded reset request of the different characteristic.

12. The method of claim 10, wherein the received reset request of the different characteristic is associated with a first reset reaction that includes an action that is not associated with the forwarded reset request of the different characteristic.

13. The method of claim 9, the delay period is stored at a programmable storage location.

14. An integrated semiconductor device comprising:
a reset preprocessor comprising:
a first input configured to receive a reset request,
a second input configured to receive a first state of the device,
reset modification circuitry configured to generate a modified reset based upon the reset request received at the first input and based upon the first state of the device and configured to adjust a temporal application of the reset request to the semiconductor device based upon the first state, and
an output configured to transmit the modified reset; and
a reset processor configured to effectuate a reset reaction based on the modified reset.

15. The device of claim 14, wherein the reset modification circuitry is further configured to generate the modified reset by modifying a type of the modified reset request as compared to the received reset request.

16. The device of claim 14, wherein the first state is a state of a first portion of the semiconductor device that implements a first function, and the reset request is from a second portion of the semiconductor device that implements a second function.

17. The device of claim 14, wherein the reset preprocessor is implemented with an application-specific integrated circuit (ASIC).

* * * * *